US009583891B2

(12) United States Patent
Pulvermacher

(10) Patent No.: US 9,583,891 B2
(45) Date of Patent: Feb. 28, 2017

(54) HIGH-DENSITY ELECTRICAL CONNECTOR FOR PLURAL MULTI-CONTACT LINEAR-ARRAY CONNECTIONS

(71) Applicant: Ad-Tech Medical Instrument Corporation, Racine, WI (US)

(72) Inventor: Ronald J. Pulvermacher, Sun Prairie, WI (US)

(73) Assignee: Ad-Tech Medical Instrument Corp., Racine, WI (US)

( * ) Notice: Subject to any disclaimer, the term of this patent is extended or adjusted under 35 U.S.C. 154(b) by 0 days.

(21) Appl. No.: 14/735,487

(22) Filed: Jun. 10, 2015

(65) Prior Publication Data

US 2016/0365677 A1 Dec. 15, 2016

(51) Int. Cl.

*H01R 12/00* (2006.01)
*H05K 1/00* (2006.01)
*H01R 13/66* (2006.01)

(52) U.S. Cl.

CPC .................................. *H01R 13/665* (2013.01)

(58) Field of Classification Search

CPC .. H01R 12/714; H01R 9/096; H01R 13/2428; H01R 13/514; H05K 2201/0999
USPC ....... 439/68, 71, 76.1, 700; 607/36; 361/752
See application file for complete search history.

(56) References Cited

U.S. PATENT DOCUMENTS

| | | |
|---|---|---|
| 4,379,462 A | 4/1983 | Borkan et al. |
| 4,461,304 A | 7/1984 | Kuperstein |
| 4,516,820 A | 5/1985 | Kuzma |
| 4,633,889 A | 1/1987 | Talalla et al. |
| 4,676,258 A | 6/1987 | Inokuchi et al. |
| 4,712,557 A | 12/1987 | Harris |
| 4,735,208 A | 4/1988 | Wyler et al. |
| 4,774,371 A | 9/1988 | Miwa et al. |
| 4,805,625 A | 2/1989 | Wyler |
| 4,850,359 A | 7/1989 | Putz |
| 4,869,255 A | 9/1989 | Putz |
| 4,903,702 A | 2/1990 | Putz |
| 5,044,368 A | 9/1991 | Putz |
| 5,097,835 A | 3/1992 | Putz |
| 5,560,358 A | 10/1996 | Arnold et al. |
| 5,902,236 A | 5/1999 | Iversen |
| 6,415,168 B1 | 7/2002 | Putz |
| 6,575,759 B1 | 6/2003 | Ollivier |

(Continued)

FOREIGN PATENT DOCUMENTS

WO 2011063444 A1 6/2011

*Primary Examiner* — Hae Moon Hyeon

(74) *Attorney, Agent, or Firm* — Jansson Munger; McKinley & Kirby Ltd.

(57) ABSTRACT

An electrical connector for connecting plural multi-contact linear arrays with an electrical system, including: a base portion having a base member and an alignment member on the base member configured to hold the multi-contact linear arrays in place; an interconnect portion configured to mate with the base portion and having (1) a plurality of pins mounted thereto, each pin positioned for contact with a respective contact of the multi-contact linear arrays, and (2) an interconnect array having a plurality of conductive pathways to the electrical system; and one or more closure elements for holding the base and interconnect portions together, wherein each of the contacts of the multi-contact linear arrays is electrically connected to a corresponding point in circuits within the electrical system.

27 Claims, 10 Drawing Sheets

(56) References Cited

U.S. PATENT DOCUMENTS

| | | | | |
|---|---|---|---|---|
| 7,056,149 | B1 * | 6/2006 | Lanni | H01R 13/6456 439/488 |
| 7,425,142 | B1 | 9/2008 | Putz | |
| 7,534,127 | B2 * | 5/2009 | Parker | A61N 1/36032 439/425 |
| 8,116,099 | B2 * | 2/2012 | Kubota | H05K 1/141 174/261 |
| 8,162,684 | B1 | 4/2012 | Sochor | |
| 8,267,708 | B1 | 9/2012 | Sochor | |
| 8,435,079 | B1 | 5/2013 | Osa et al. | |
| 8,439,714 | B2 | 5/2013 | Putz | |
| 2003/0199948 | A1 | 10/2003 | Kokones et al. | |
| 2011/0270068 | A1 | 11/2011 | Mehdizadeh et al. | |
| 2012/0135624 | A1 * | 5/2012 | Putz | H01R 4/5008 439/345 |

* cited by examiner

DETAIL B

DETAIL C

HIGH-DENSITY ELECTRICAL CONNECTOR FOR PLURAL MULTI-CONTACT LINEAR-ARRAY CONNECTIONS

FIELD OF THE INVENTION

The field relates generally to high-density electrical connectors and systems for facilitating connections of a multiplicity of electrical elements to one of more components in a space-efficient manner. One particular field is medical connectors for electrodes used for monitoring and mapping of brain activity in patients with neurological disorders.

BACKGROUND OF THE INVENTION

Microelectronic systems and sensors continue to achieve higher densities and smaller footprints. Such advances are accompanied by the need for more compact, higher-density ways to connect large numbers of elements to such systems. One exemplary area of such need deals with connecting a large number of contacts for sensing EEG signals from the human brain. Epileptogenic mapping is one example of the use of electrical devices with a tissue-engagement contacts, and accurate sensing of intracranial electrical activity, such as for determining epileptogenic foci or otherwise, often requires using a large number of brain contacts. Although the invention disclosed herein is more broadly applicable to many electrical systems, electrical systems for epileptogenic mapping are used as the context for disclosure of this invention.

Examples of two kinds of intracranial electrical contact devices are depth probes and flexible flat surface members. Depth probes, which may be referred to as "depth electrodes," penetrate deep into the brain tissue. On the other hand, flexible flat surface members, including what are sometimes referred to as "strip" electrodes and "grid" electrodes, may be placed subdurally in direct contact with brain tissue at the surface of the brain.

Examples of such electrodes include but are not limited to electrodes described in U.S. Pat. No. 4,735,208 (Wyler et al.), U.S. Pat. No. 4,805,625 (Putz), U.S. Pat. No. 4,903,702 (Putz), U.S. Pat. No. 5,044,368 (Putz), and U.S. Pat. No. 5,097,835 (Putz).

Each of these different kinds of intracranial tissue-engagement electrodes are connected to some circuitry which typically captures and records the EEG signals for analysis of various types. There is a diagnostic need for an increased number of electrodes in order to increase the precision of analysis and diagnosis based on the captured EEG information. An increase in the number of electrodes requires higher data transmission bandwidths if the full amount of data captured from the electrodes is delivered to the monitoring system electronics. Further, there is a diagnostic need to monitor patients for longer periods of time, again for increased precision of diagnosis.

Multi-contact medical electrode devices are placed in the human body for various purposes, such as brain-mapping in epilepsy treatment. In such treatments wires generally extend from the multi-contact medical electrode to a multi-contact tail. The multi-contact tail is linear in shape and contains an array of sleeve-like contacts spaced therealong. The multiple contacts of the multi-contact tail are to facilitate quick electrical connection of the contacts of the multi-contact medical electrode device such as for monitoring, recording and analysis purposes. Connectors have been configured to simultaneously engage the contacts of the multi-contact tail for their individual electrical connection to separate wire strands which emerge from the connector.

Various connectors have been developed to facilitate multi-contact connection. Examples of such prior art multi-contact medical connectors are those disclosed in the following U.S. Pat. No. 4,379,462 (Borkan et al.), U.S. Pat. No. 4,461,304 (Kuperstein), U.S. Pat. No. 4,516,820 (Kuzma), U.S. Pat. No. 4,633,889 (Talalla et al.), U.S. Pat. No. 4,676,258 (Inokuchi et al.), U.S. Pat. No. 4,712,557 (Harris), U.S. Pat. No. 4,744,371 (Harris), U.S. Pat. No. 4,850,359 (Putz), U.S. Pat. No. 4,869,255 (Putz), U.S. Pat. No. 5,560,358 (Arnold et al.), U.S. Pat. No. 5,902,236 (Iversen), U.S. Pat. No. 6,415,168 (Putz), U.S. Pat. No. 6,575,759 (Ollivier), U.S. Pat. No. 7,425,142 (Putz), and U.S. Pat. No. 8,439,714 (Putz).

Some medical connectors of the prior art have a number of shortcomings. One concern in a surgical setting that involves much equipment, many wires and hoses and the like, is that the connector be small in size to facilitate easy operation by medical personnel. It would be advantageous to have a connector which has a high-density of connections and which can be easily maneuvered by medical personnel during and after surgery. A slim design is particularly advantageous with respect to connectors that have a great number of contacts. Some connectors in the prior art are large in size and clumsy, making them difficult to organize and manage.

When using a medical connector it is important that a constant and reliable electrical connection be present so that accurate information can be obtained. Some connectors in the prior art may create concerns with reliability of the connection. A reliable electrical connection is also of paramount importance since the connectors are often in use for lengthy periods of time. If a connector fails during use, all of the information obtained may be lost or rendered inaccurate.

Medical connectors for use in patients who have a seizure tendency must also be secure. If a patient has a seizure there is the chance that the electrical connections could be destroyed or disrupted. Specifically, the multi-contact tails of electrodes having multiple contacts can become dislodged or broken by involuntary movements occurring during a seizure. Therefore, it is important that the connector be secure so that it can withstand the jerking motions that are characteristic of seizures.

It is also important that, with a large number of connections to be made, the possibility of confusion in placement of connections be minimized.

In summary, there are problems and shortcomings in the prior art connectors for use with multi-contact medical electrode devices.

OBJECTS OF THE INVENTION

It is an object of this invention to provide a single connector which facilitates the connections to an electrical system for a plurality of multi-contact linear arrays.

Another object of this invention is to provide such an electrical connector which is compact and both space and weight efficient.

Another object of this invention is to provide such a connector in which it is easy to install and remove individual linear arrays.

Another object of this invention is to provide such a connector which holds the linear arrays in place during installation and removal of the linear arrays.

Another object of this invention is to provide such a connector which operates reliably both electrically and mechanically.

Another object of this invention is to provide such a connector which is secure and can withstand a level of force on the linear arrays while the connector is in a closed position.

Yet another object of this invention is to provide an electrical connector which minimizes or eliminate the possibility of connection errors.

These and other objects of the invention will be apparent from the following descriptions and from the drawings.

SUMMARY OF THE INVENTION

The invention disclosed herein is an electrical connector for connecting plural multi-contact linear arrays to an electrical system. The inventive connector comprises: (a) a base portion which includes a base member and an alignment member on the base member configured to hold the multi-contact linear arrays in place; (b) an interconnect portion which is configured to mate with the base portion and which includes (i) a plurality of pins mounted thereto, each pin positioned for contact with a respective contact of the multi-contact linear arrays and (ii) an interconnect array having a plurality of conductive pathways to the electrical system; and (c) one or more closure elements for holding the base and interconnect portions together. In the inventive connector, each of the contacts of the multi-contact linear arrays is electrically connected to a corresponding point in circuits within the electrical system.

In highly preferred embodiments of the inventive connector, the interconnect array comprises a printed circuit board to which the plurality of pins are mounted, and in some of these embodiments, one or more interface connectors are mounted to the circuit board and are configured to mate with one or more corresponding system connectors of the electrical system.

In certain preferred embodiments, the alignment member is made of a resilient material.

In certain preferred embodiments, the pins are spring pins, and in some of these embodiments, the alignment member is made of a resilient material.

In some embodiments of the inventive connector, base and interconnect portions are substantially planar.

In some embodiments, the alignment member is configured to hold substantially straight linear arrays.

In some preferred embodiments, the alignment member is configured to hold linear arrays which include substantially cylindrical contacts.

In some embodiments, the interconnect portion is configured to electrically connect with linear arrays which have different numbers of contacts.

In some embodiments, the interconnect portion is configured to electrically connect with one or more linear arrays having the same contact pitch, and in some of these embodiments, the interconnect portion is configured to electrically connect with linear arrays all of which have the same contact pitch.

In some highly preferred embodiments of the inventive connector, the alignment member is configured to permit individual installation and removal of linear arrays.

In certain highly preferred embodiments, the alignment member includes visible indicators of the intended placement of one or more of the linear arrays. In some of these embodiments, the visible indicators are color-coded regions of the alignment member, and in others, the visible indicators are text characters.

In certain preferred embodiments, the base portion includes positioning elements for fixing the relative position of the base portion and the interconnect portion, and in some of these embodiments, at least a portion of the positioning elements are positioning pins.

In some embodiments, the base and alignment members are configured to be mated in only one relative position.

In some embodiments, each of the contacts of the multi-contact linear arrays is contacted by a single corresponding pin.

In certain embodiments, the closure elements removably hold the base and interconnect portions together, and in some of these embodiments, the closure elements are threaded fasteners.

In highly preferred embodiments of the inventive connector, the closure elements attach the base portion to the electrical system, thereby sandwiching the interconnect portion therebetween. In some of these embodiments, the base portion is removable from the electrical connector independent of the interconnect portion.

In certain embodiments, the base and alignment members form an integral base portion.

In another aspect of the present invention, the inventive connector is an electrical connector for connecting plural multi-contact tails of one or more in-body medical electrodes to an electrical system. The inventive connector comprises: (a) a base portion which includes a base member and an alignment member on the base member configured to hold the multi-contact tails in place; (b) an interconnect portion which is configured to mate with the base portion and which includes (i) a plurality of pins mounted thereto, each pin positioned for contact with a respective contact of the multi-contact tails and (ii) an interconnect array having a plurality of conductive pathways to the electrical system; and (c) one or more closure elements for holding the base and interconnect portions together. In the inventive connector, each of the contacts of the multi-contact tails is electrically connected to a corresponding point in circuits within the electrical system.

In certain embodiments of this inventive connector, the base portion is made of non-ferrous materials, and in some of these embodiments, the base portion is made of non-metallic materials.

The term "multi-contact linear array" as used herein refers to an elongate electrical structure having multiple contacts along its length. Such a linear array is not limited to being a straight structure but may be curved along its length and may be either flexible or rigid. One example of a multi-contact linear array is called a "tail" and consists of a linear dielectric member enclosing multiple conductors and a linear array of sleeve-like contacts spaced therealong and each connected, respectively, to one of the multiple conductors. The embodiment described in detail herein is configured to connect to a plurality of tails, but the invention disclosed herein is not limited to a connector only intended for use with such tails.

The term "pin" as used herein with respect to a pin mounted to a circuit board refers to an electrically-conductive structure which is configured to contact another electrically-conductive structure in order to close an electrical circuit. The end of the pin for such electrical contact is not limited to being a simple pointed or rounded tip but may also be a shaped end which is configured to mate with a complementary shape on the object being contacted. As will be seen herein, one embodiment of a pin may also include internal structure such a spring to assist in making the necessary electrical contact. In addition, as used herein, the term "pin" may refer to other contacting structures such as a leaf contact or similar structures.

The term "contact pitch" as used herein refers to the center-to-center spacing of the contact of a linear array along the length of the array.

The term "resilient" as used herein refers to the material property that describes a material readily returning to its original shape after the removal of forces causing deformation.

The term "medical electrodes" as used herein refers to devices having one or more electrical contacts for use within a living body.

DETAILED DESCRIPTION OF PREFERRED EMBODIMENTS

Figure 1:
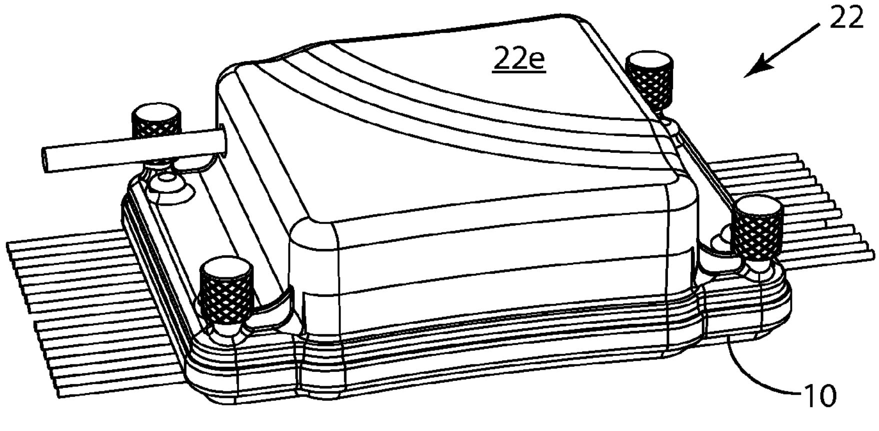
FIG. 1 is a perspective view of an exemplary embodiment of apparatus utilizing the high-density electrical connector of this invention. In the embodiment illustrated in the figures, the multi-contact linear arrays are tails as defined above.

FIG. 1 is a perspective view of an exemplary embodiment of apparatus which utilizes the high-density electrical connector of this invention. For purposes of example only, the electrical system with which the inventive electrical connector is used in the drawings of this application is a system for capturing electrical signals from the cortex of a brain to a computer system which stores, analyzes and displays the signals for purposes of the monitoring and mapping of brain activity in patients with neurological disorders.

An embodiment 10 of the electrical connector (also indicated by reference number 10) is illustrated with an electrical system 22. In FIG. 1, high-density electrical connector 10 is shown on the bottom of electrical system 22, although such "bottom" positioning of connector 10 with respect to electrical system 22 is not intended to be limiting. Connector 10 connects a plurality of tails 12 (multi-contact linear arrays) to electrical system 22. In this exemplary embodiment, among the types of devices with which tails 12 may be associated are depth electrodes, strip electrodes and grid electrodes, each of which include a multiplicity of contacts to which tails 12 are attached. As earlier described in this application, such tails 12 are one embodiment of multi-contact linear arrays which the inventive electrical connects to an electrical system. Each tail 12 includes multiple contacts 14, each contact 14 electrically-connected to a corresponding contact within an electrode device (not shown) previously mentioned.

Electrical system 22 includes electrical system circuits 22_c_ and is contained within an enclosure 22_e_, both of which are not part of inventive connector 10 but are illustrated in one or more figures herein for clarity.

Figure 2:
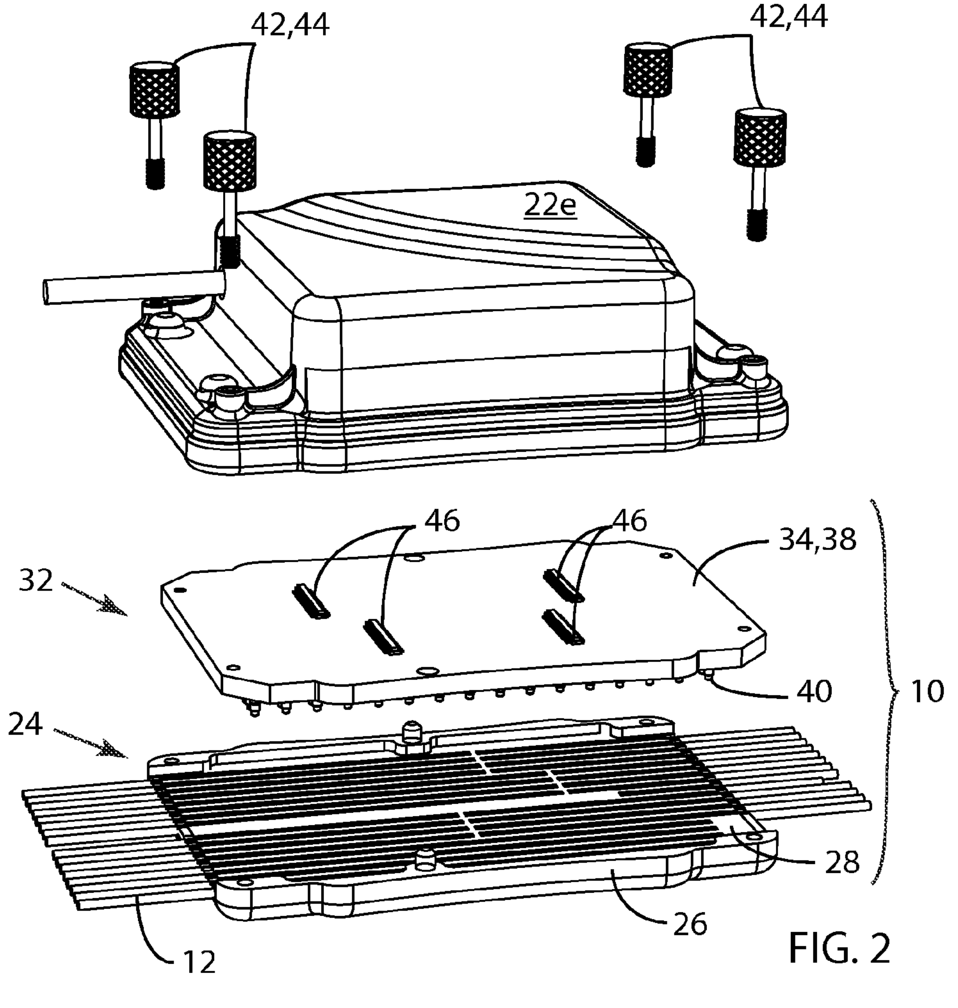
FIG. 2 is a partially-exploded perspective view of the apparatus of FIG. 1. The lower portion of FIG. 2 is an illustration of an embodiment of the high-density electrical connector of this invention, as indicated in FIG. 2.

FIG. 2 is a partially-exploded perspective view of the apparatus shown in FIG. 1. Connector 10 includes a base portion 24 comprising a base member 26 and an alignment member 28. In this embodiment, base member 26 is a generally planar, rigid structure into which alignment member 28 is configured to fit. Alignment member 28 is made of a resilient material and includes a plurality of tail-holding grooves 30. Grooves 30 and the properties of the resilient material are configured such that tails 12, when put in place within grooves 30 of alignment member 28, are held in place by the shapes and sizing of the grooves 30 and the material resilience. Such configuration enables a user to place an individual tail 12 in (or remove from) alignment member 28 and have tails 12 be held in place while additional tails 12 are placed in (or removed from) alignment member 28.

The resilience of the material of alignment member 28 is also useful for establishing good electrical contact within connector 10 as will be described later in this application. Alignment member 28 may be made of resilient materials such as silicone or other similar elastic and insulating materials.

Base portion 24 of connector 10 also includes an interconnect portion 32 which is configured to mate with base portion 24 to effect electrical connections within connector 10. Interconnect portion 32 includes an interconnect array 34 which includes a plurality of conductive pathways 36 (see exemplary pathways 36 in FIG. 9B), a plurality of pins 40, and one or more interface connectors 46. In connector embodiment 10, interconnect array 34 is a printed circuit board 38, pins 40 are spring pins 40, and interconnect portion 34 includes four interface connectors 46.

Each of spring pins 40 is mounted on printed circuit board 38 and positioned for contact with a respective contact 14 of a tail 12. Four interface connectors 46 are mounted to printed circuit board 38 and are configured to mate with one or more corresponding system connectors 46*s* (see FIG. 11) of electrical system 22. Connector 10 also includes four closure elements 42 which are threaded fasteners 44 for holding base portion 24 and interconnect portion 32 together. Connector 10 thereby electrically connects each contact 14 of tails 12 to a corresponding point in circuits 22*e* (see FIGS. 11 and 12A) within electrical system 22.

As can be seen in FIG. 2 and in several other figures herein, in connector embodiment 10, tails 12 are held in place within alignment member 28 as straight multi-contact linear arrays (also 12). However, alignment member 28 may also be configured such that multi-contact linear arrays 12 may not be placed in a straight configuration within alignment member 28; such non-straight configurations are discussed above and are anticipated to be within the scope of this invention.

Figure 3:
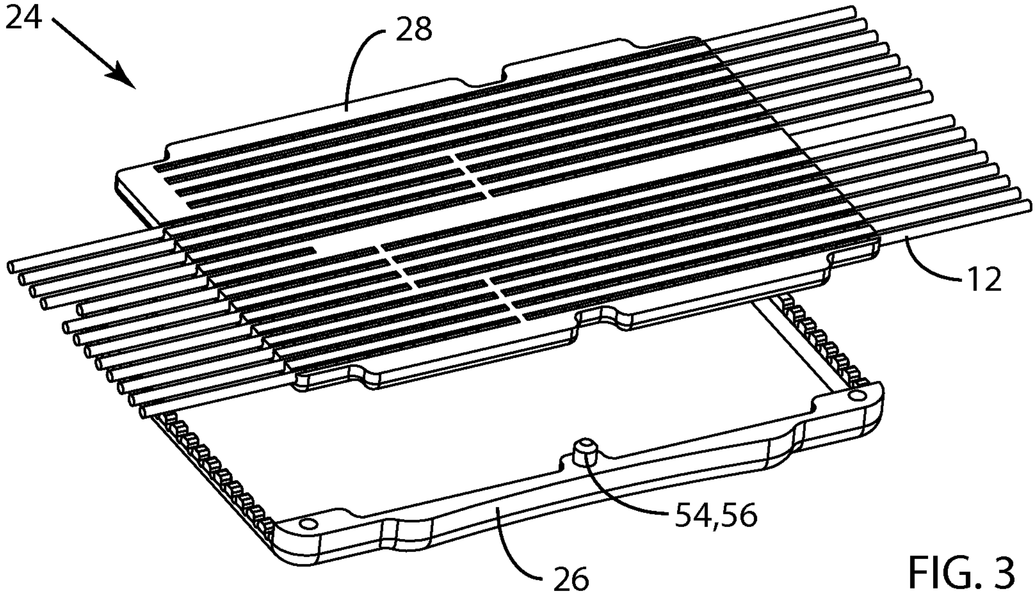
FIG. 3 is an exploded perspective view of the base portion from the embodiment of FIG. 2. The tails are shown but are not part of the inventive connector.

FIG. 3 is an exploded perspective view of base portion 24 of connector 10, showing alignment member 28 holding a plurality of tails 12 (only one tail 12 labeled). FIG. 3 illustrates how resilient alignment member 28 mates with base member 26. Base member includes two positioning elements 54 which in connector embodiment 10 are positioning pins 56. Only one such positioning pin 56 is shown in FIG. 3 but two are illustrated in several other figures herein. As already mentioned, tails 12 are shown but are not part of the inventive connector.

Figure 4:
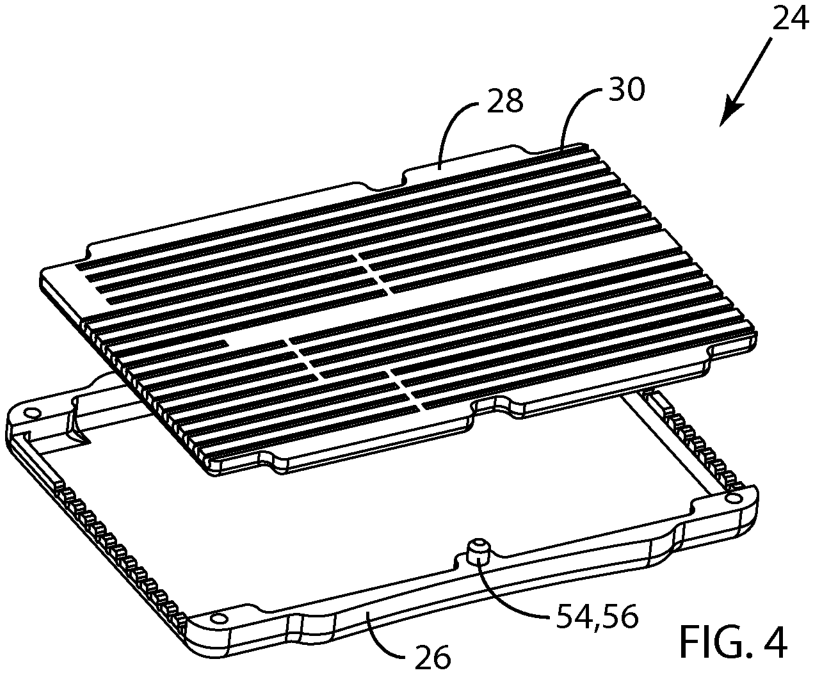
FIG. 4 is an exploded perspective view of the base portion of the embodiment of FIG. 3 shown without the tails.

FIG. 4 is an exploded perspective view showing base portion 26 and alignment member 28 without tails 12 to more easily illustrate the plurality of tail-holding grooves 30 (only one numbered).

Figure 5A:
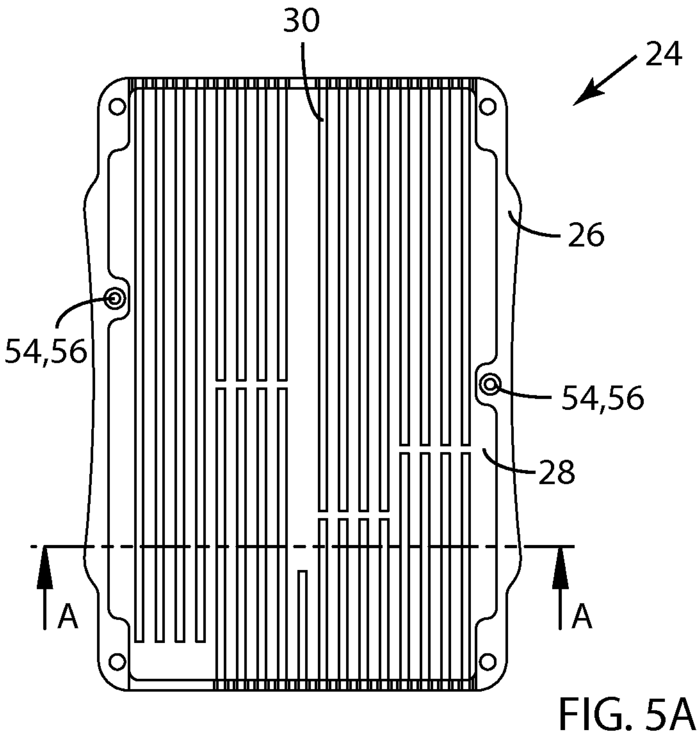
FIG. 5A is a top elevation view of the base portion of the connector embodiment of FIG. 2.
Figure 5B:
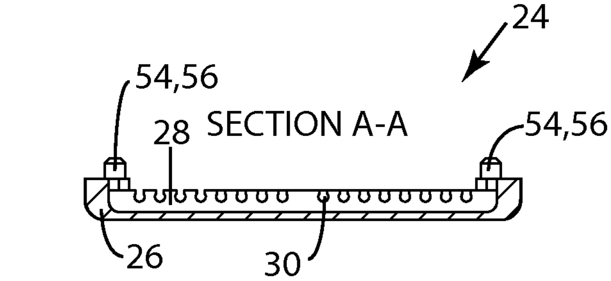
FIG. 5B is a cross-section view of the base portion of FIG. 5A at the location indicated in FIG. 5A.

FIG. 5A is a top elevation view of base portion 24 of connector embodiment 10 further illustrating the configuration of the elements of base portion 24 and indicating the position of section A-A shown in FIG. 5B. FIG. 5A illustrates the plurality of tail-holding grooves 30 having several different lengths to hold tails 12 having different numbers of contacts 14. In FIG. 5A, tail-holding grooves 30 are configured to hold tails 12 of eight different lengths (number of contacts). This can also bee seen in FIG. 6A.

Figure 5C:
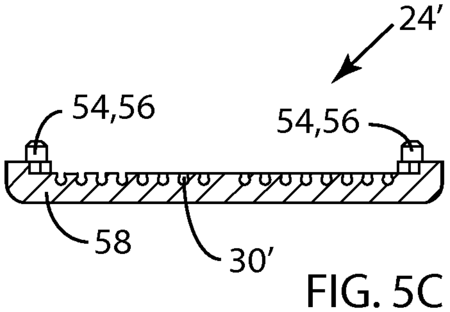
FIG. 5C is a cross-sectional view of another embodiment of the base portion along cross-section similar to that of FIG. 5B. In this embodiment, the base member and alignment member form an integral base portion.

Best seen in FIG. 5B is the mating relationship of resilient alignment member 28 within base member 26 of connector embodiment 10. FIG. 5C is a drawing similar to FIG. 5B but illustrating a base member 24' including an integral base and alignment member 58. Base member 24' also includes positioning elements 54 as positioning pins 56. The sizing and material selection for integral base and alignment member 58 depend on the material properties of multi-contact linear arrays 12 such that tails 12 can be held in place within a set of tail-holding grooves 30'.

Figure 6A:
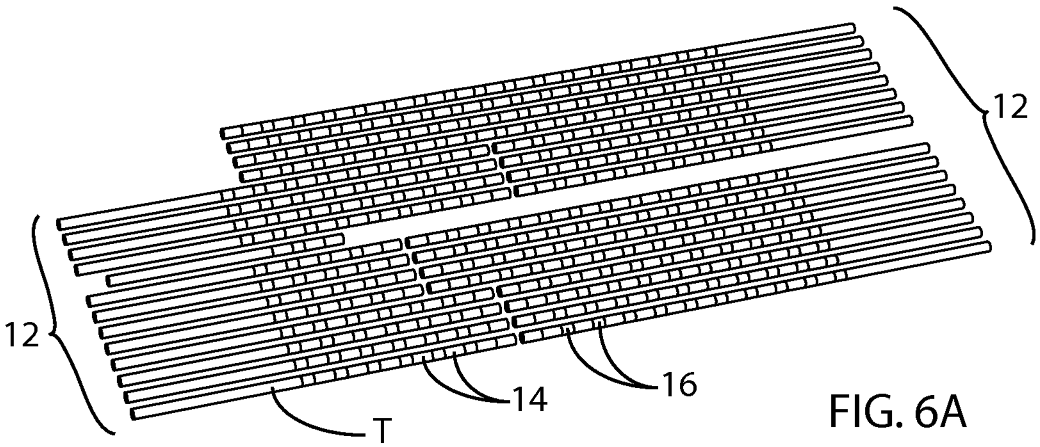
FIG. 6A is a perspective view showing only the plural tails from the apparatus of FIG. 1.

FIG. 6A is a perspective view showing only plural tails 12 from electrical system 22. FIG. 6A illustrates twenty-nine tails 12 of differing lengths and having differing numbers of contacts 14.

Figure 6B:
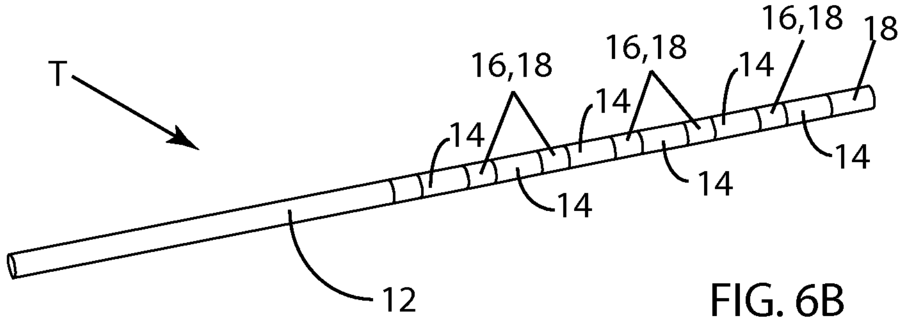
FIG. 6B is an enlarged perspective view showing only a single tail as indicated in FIG. 6A.

FIG. 6B is an enlarged perspective view showing only a single tail as indicated in FIG. 6A. FIG. 6A also indicates tail T which is shown in the enlargement of FIG. 6B. Tails 12, including tail T, include multiple conductors as appropriate which are encased in a dielectric material 18. Tail T includes six substantially- or generally-cylindrical contacts 14 which are separated from each other by a set of inter-contact spaces 16 of dielectric material 18. Tails 12 in FIGS. 6A and 6B are shown as being straight but may also be curved, as described above.

Figure 7:
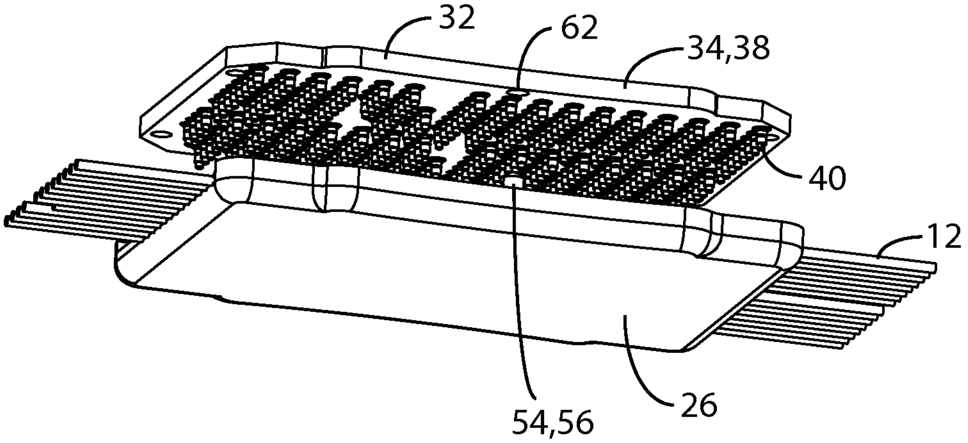
FIG. 7 is a partially-exploded perspective view of the high-density electrical connector embodiment of FIG. 2 rotated to show the spring pins on the interconnect portion, which in this embodiment includes a printed circuit board. As in FIG. 2, the tails are shown but are not part of the inventive connector. Also in FIG. 7, the closure elements (in this embodiment, threaded fasteners) are not shown.
Figure 8:
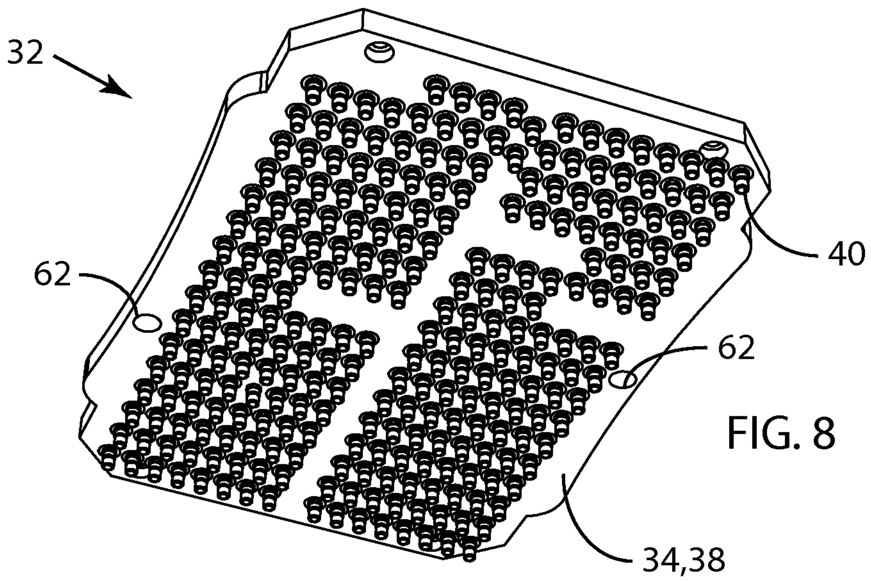
FIG. 8 is an enlarged perspective view of the printed circuit board of FIG. 7 rotated to show the spring pins more clearly.

FIG. 7 is a partially-exploded perspective view of high-density electrical connector embodiment 10 which has been oriented to show spring pins 40 the interconnect portion 32. Spring pins 40 are positioned on printed circuit board 38 to align with contacts 14 of tails 12. The arrangement of pins 40 depends on the function and configuration of electrical system 22. FIG. 8 presents a slightly enlarged perspective view of printed circuit board 38 rotated to show spring pins 40 more clearly. Interconnect array 32 of connector embodiment 10 includes two holes 62 for positioning pins 56 as shown in FIG. 8. Positioning pins 56 and holes 62 are configured to fix the relative position of base portion 24 and interconnect portion 32 due to holes 62 and pins 56 each not being at middle positions along edges of base portion 24 and interconnect portion 32. Other configurations such as shapes of mating parts are anticipated by the invention to ensure unique relative positioning of base member 26 and alignment member 28.

As illustrated in FIGS. 3, 6A and 7, connector embodiment 10 is configured to electrically connect with tails 12 with contacts 14 having the same contact pitch.

Figure 9A:
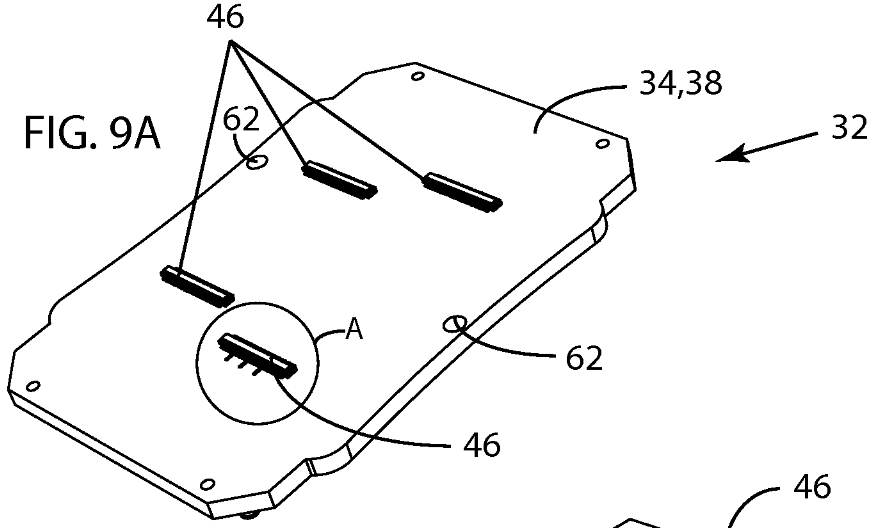
FIG. 9A is a perspective view illustrating of the printed circuit board of the embodiment of FIG. 8 rotated to show four interface connectors and to indicate a portion to be enlarged in FIG. 9B.
Figure 9B:
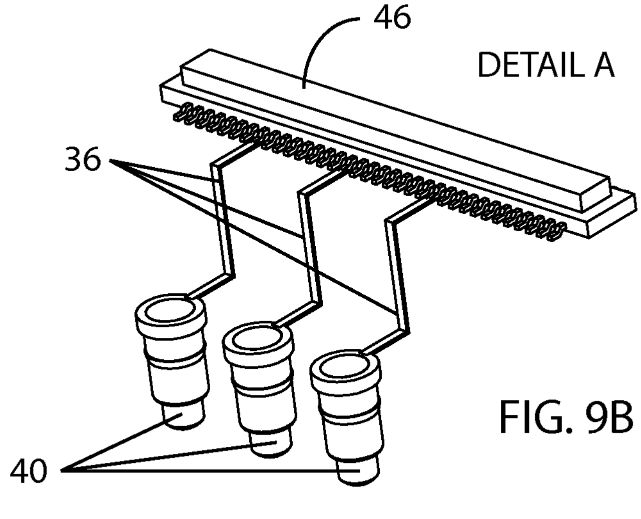
FIG. 9B is a perspective view illustrating the enlarged portion as indicated in FIG. 9A and in which plural (three in FIG. 10B) exemplary conductive pathways internal to the printed circuit board are shown.

FIG. 9A is a perspective view illustrating of printed circuit board 38 of connector embodiment 10 rotated to show four interface connectors 46 and to indicate a portion of the drawing enlarged in FIG. 9B.

FIG. 9B is a perspective view illustrating the enlarged portion as indicated in FIG. 9A and in which plural (three in FIG. 10B) exemplary conductive pathways 36 internal to printed circuit board 38 are shown. Printed circuit board 38 (interconnect array 34) includes numerous interface pathways 36 configured to connect spring pins 40 to conductors within interface connectors 46. Exemplary connector 10 as illustrated herein includes 258 spring pins 40 and the associated pathways 36, most of which are not shown. Pathways 36 are primarily internal to printed circuit board 38.

As shown at least in FIGS. 5A, 8 and 9A, positioning pins 56 and holes 62 are positioned such that base portion 24 and interconnect portion 32 are able to be mated in only one relative position.

Figure 10A:
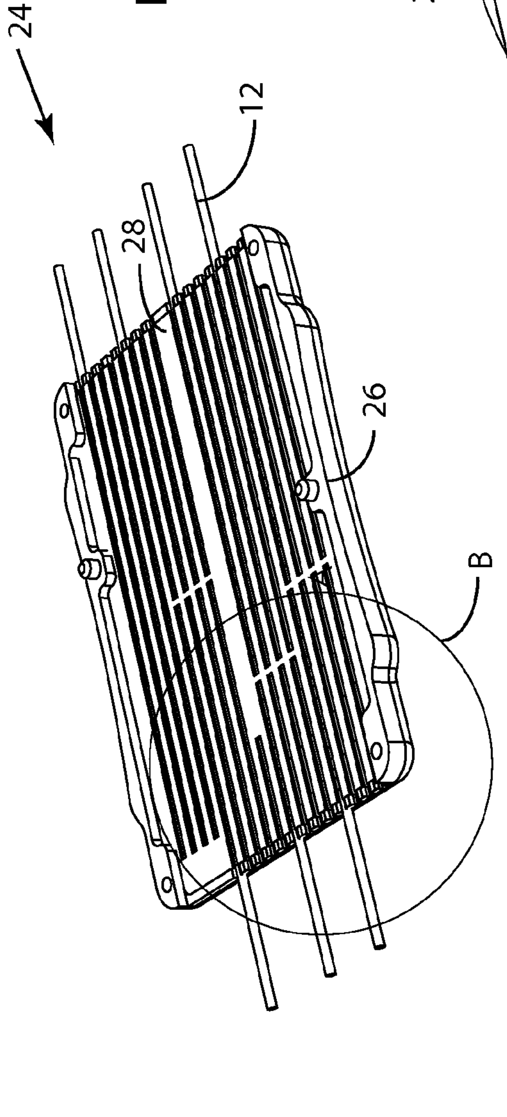
FIG. 10A is a perspective view of an embodiment of the base portion of the inventive high-density electrical connector indicating a region to be enlarged in FIG. 10B.
Figure 10B:
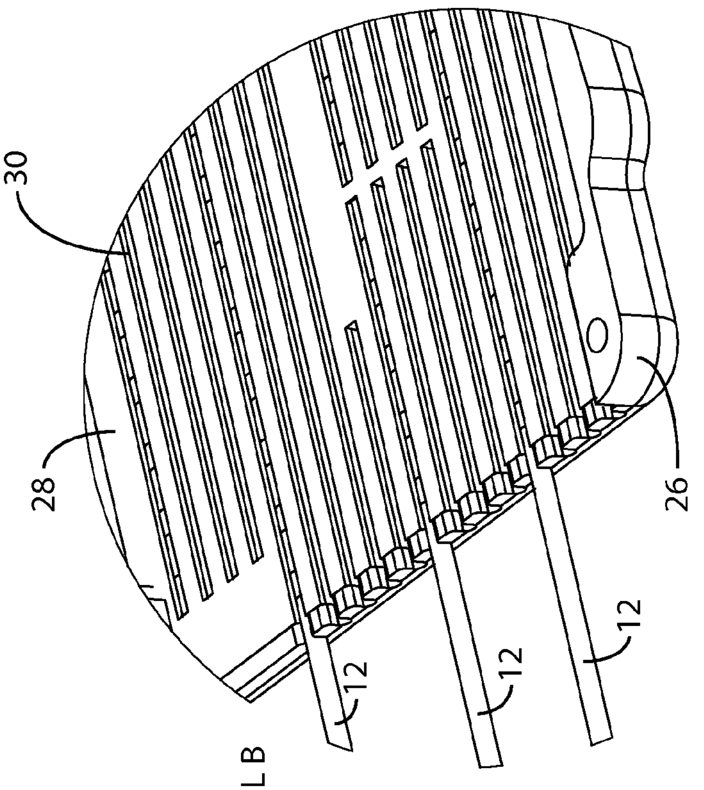
FIG. 10B is a magnified perspective view of a section of the base portion of the high-density electrical connector of FIG. 10A.

FIG. 10A is a perspective view of base portion 24 of connector embodiment 10 indicating a region to be enlarged in FIG. 10B. FIG. 10B is a magnified perspective view of a section of base portion 24 illustrating three tails 12 placed in alignment member 28 and showing more clearly tail-holding grooves 30.

Figure 11:
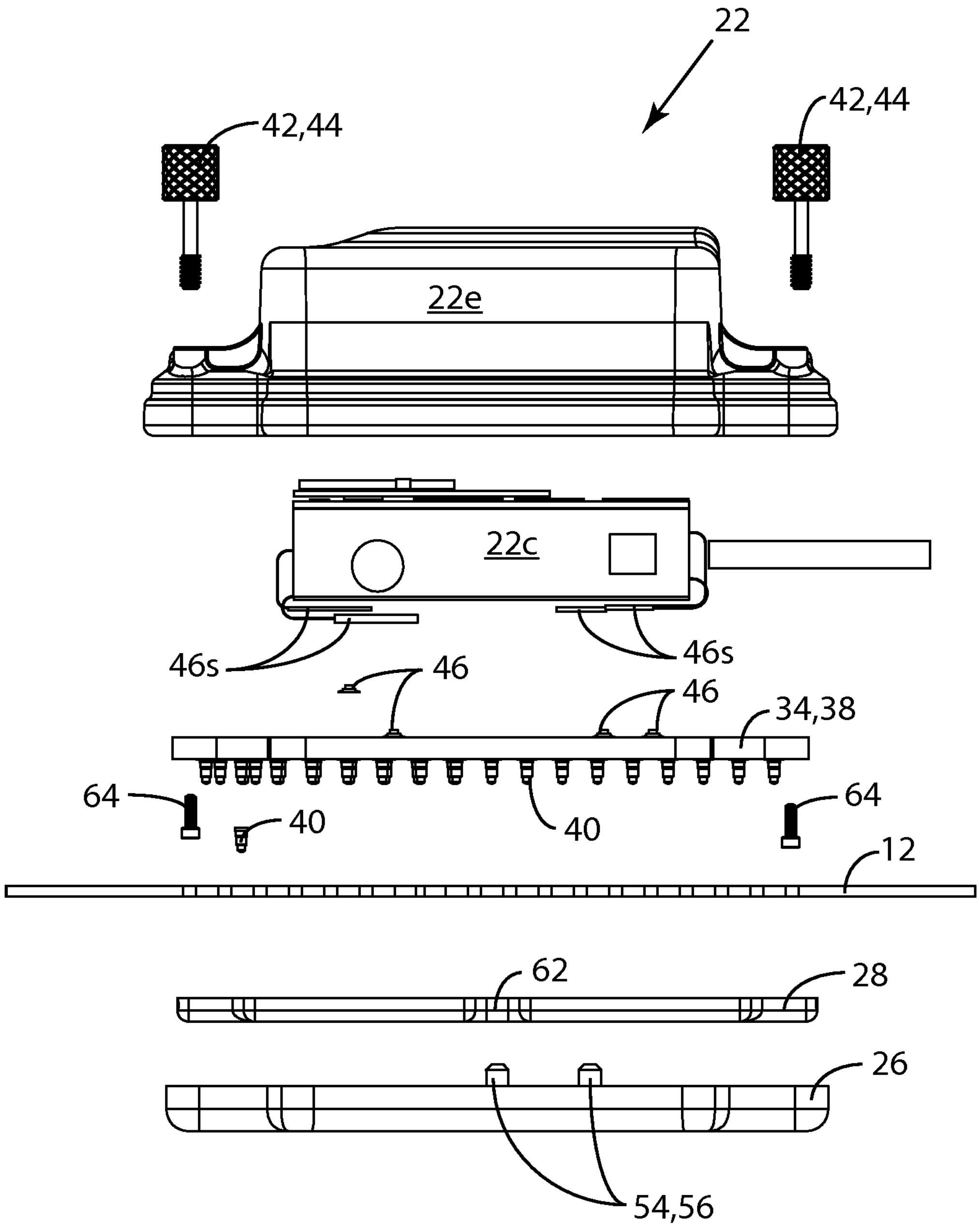
FIG. 11 is an exploded side-elevation view of the apparatus of FIG. 1.

FIG. 11 is an exploded side-elevation view of the apparatus of FIG. 1. Components of this apparatus which have not been illustrated previously include a set of fasteners 64 (two shown) which are used attach interconnect portion 32 to electrical system 22, thus enabling base portion 24 to be removed from connector 10 independent of interconnect portion 32. FIG. 11 also illustrates circuits 22*c* of electrical system 22 having four system connectors 46*s* which are configured to mate with interface connectors 46. In addition, FIG. 11 illustrates the offset positions of positioning pins 56 which ensure that the relative positions of base portion 24 and interconnect portion 32 are fixed.

Figure 12A:
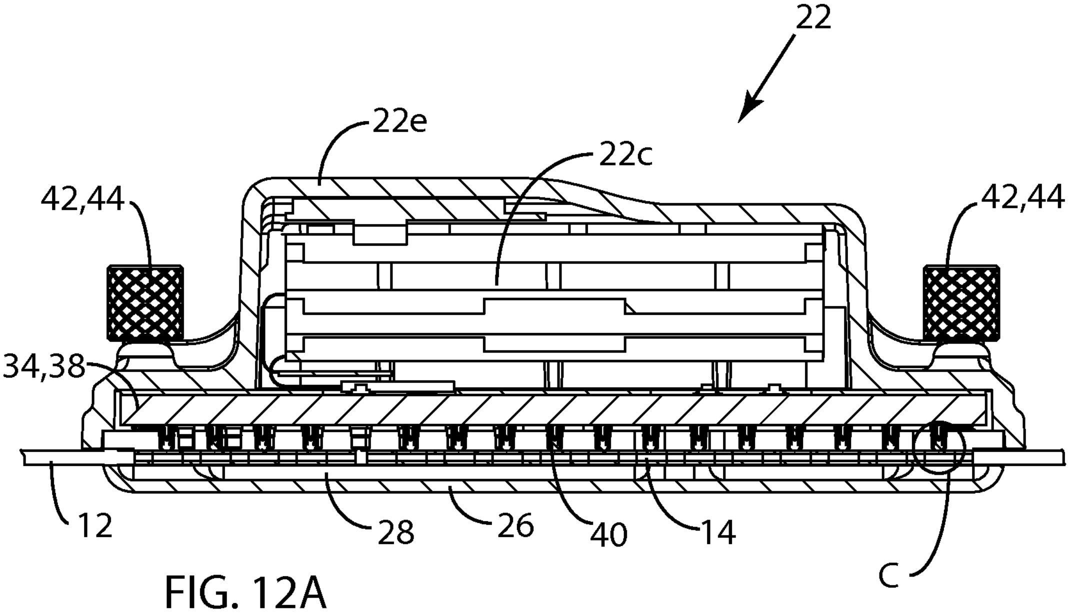
FIG. 12A is a cross-sectional view of the apparatus of FIG. 1 indicating a region to be enlarged in FIG. 12B.
Figure 12B:
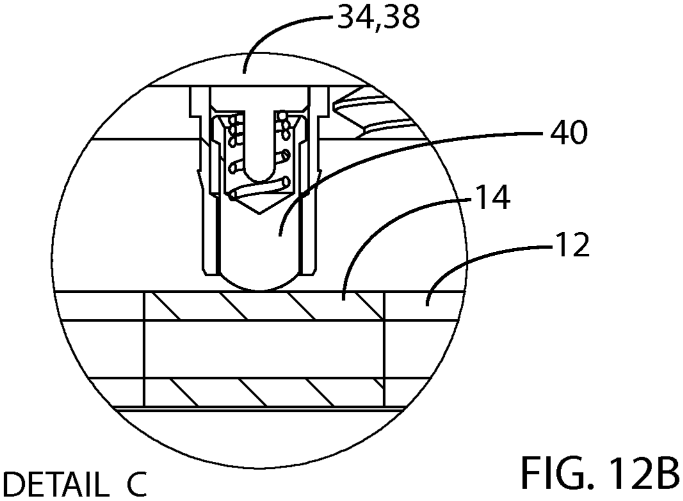
FIG. 12B is an enlarged cross-section of a spring pin in contact with one contact of a tail in the region of the drawing indicated in FIG. 12A.

FIG. 12A is a cross-sectional view of the apparatus of FIG. 1 indicating a region to be enlarged in FIG. 12B. FIG. 12B is an enlarged cross-sectional detailed view of one spring pin 40 in contact with one contact 14 of tail 12. Spring pin 40 is mounted on printed circuit board 38, and contact 14 in tail 12 is substantially cylindrical. In connector embodiment 10, good electrical contact between spring pin 40 and contact 14 is achieved by: (a) precise relative positioning of spring pin 40 and contact 14; (b) spring force provided by spring pin 40; and (c) spring force provided by the resilience of resilient alignment member 28. It is anticipated that in some other configurations, not all of these factors need be present for good electrical contact to be achieved.

Figure 13:
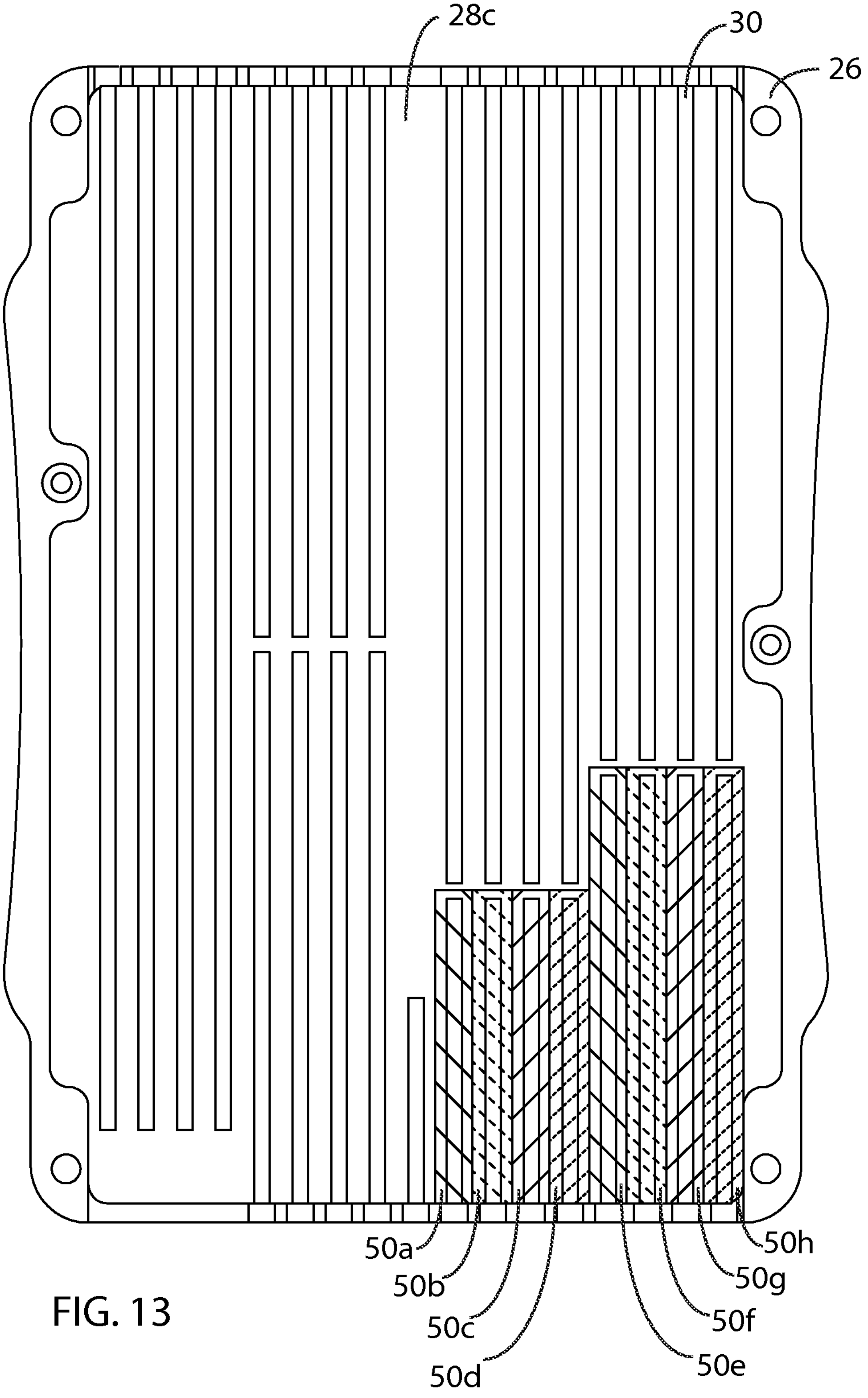
FIG. 13 is a top-surface plan view of an embodiment of the alignment member illustrating visible indicators which are exemplary color-coded regions of the alignment member.

FIG. 13 is a top-surface plan view of an alignment member 28*c* mated with base member 26. Alignment member 28*c* includes exemplary color-coded regions 50*a*-50*h* as visible indicators to assist a user in placing tails 12 in the proper tail-holding groove 30. Exemplary color-coded regions 50*a*-50*h* are indicated by different cross-hatched patterns to represent the different colors of the regions.

Figure 14:
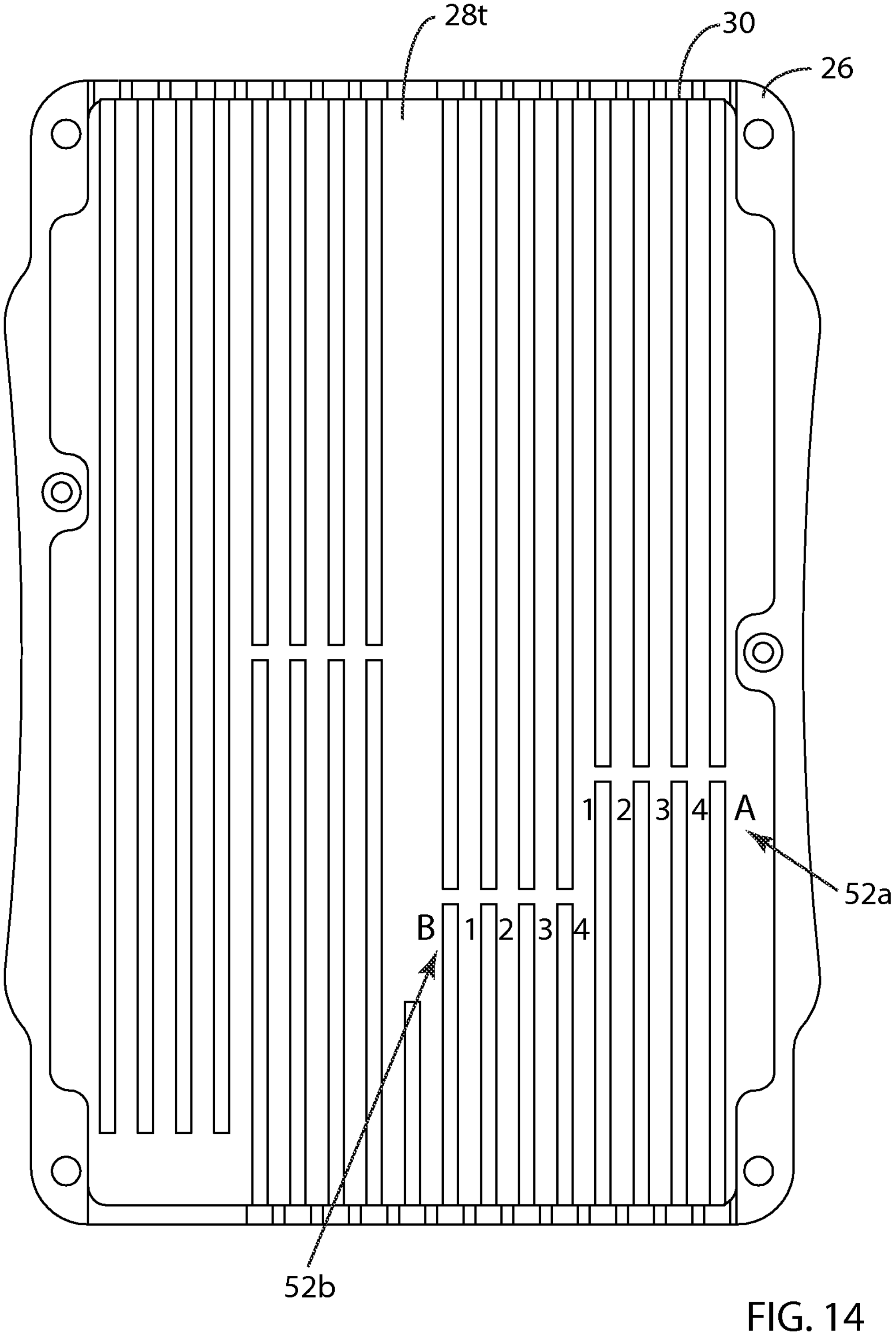
FIG. 14 is a top-surface plan view of an embodiment of an alignment member illustrating visible indicators which are exemplary text characters on the alignment member.

FIG. 14 is a top-surface plan view of an alignment member 28*t* mated with base member 26. Alignment member 28*t* includes exemplary text character groupings 52*a* and 52*b* as visible indicators to assist a user in placing tails 12 in the proper tail-holding groove 30. In alignment member 28*t*, exemplary grouping 52*a*, labeled as group A, includes four tail-holding grooves 30 labeled 1 through 4. Exemplary grouping 52*b*, labeled as group B, also has four tail-holding grooves 30 labeled 1 through 4. Many other characters and groupings of characters are possible visible indicators.

In certain medical situations, it may be necessary for base portion 26 and the tails 12 it is connecting to electrical system 22 to remain with a patient during an MRI procedure. In such instances, base portion 26 is made of non-ferrous materials, and in some of these instances, base portion 26 may be made of non-metallic materials.

While the principles of this invention have been described in connection with specific embodiments, it should be understood clearly that these descriptions are made only by way of example and are not intended to limit the scope of the invention.

The invention claimed is:

1. An electrical connector for connecting plural multi-contact linear arrays to an electrical system, the connector comprising:

- a base portion including:
  - a base member; and
  - an alignment member on the base member configured to hold the multi-contact linear arrays in place;
- an interconnect portion configured to mate with the base portion and including:
  - a plurality of pins mounted thereto, each pin positioned for contact with a respective contact of the multi-contact linear arrays;
  - a printed-circuit-board interconnect array having a plurality of conductive pathways to the electrical system, the circuit board having the plurality of pins mounted thereon; and
  - one or more interface connectors mounted to the circuit board and configured to mate with one or more corresponding system connectors of the electrical system; and
- one or more closure elements for holding the base portion and the interconnect portion together, wherein each of the contacts of the multi-contact linear arrays is electrically connected to a corresponding point in circuits within the electrical system.

2. The electrical connector of claim 1 wherein the alignment member is made of a resilient material.

3. The electrical connector of claim 1 wherein the pins are spring pins.

4. The electrical connector of claim 3 wherein the alignment member is made of a resilient material.

5. The electrical connector of claim 1 wherein the base portion and the interconnect portion are substantially planar.

6. The electrical connector of claim 1 wherein the alignment member is configured to hold substantially straight linear arrays.

7. The electrical connector of claim 1 wherein the alignment member is configured to hold to linear arrays which include substantially cylindrical contacts.

8. The electrical connector of claim 1 wherein the interconnect portion is configured to electrically connect with linear arrays which have different numbers of contacts.

9. The electrical connector of claim 1 wherein the interconnect portion is configured to electrically connect with one or more linear arrays having the same contact pitch.

10. The electrical connector of claim 9 wherein the interconnect portion is configured to electrically connect with linear arrays all of which have the same contact pitch.

11. The electrical connector of claim 1 wherein the alignment member is configured to permit individual installation and removal of linear arrays.

12. The electrical connector of claim 1 wherein the alignment member includes visible indicators of the intended placement of one or more of the linear arrays.

13. The electrical connector of claim 12 wherein the visible indicators are color-coded regions of the alignment member.

14. The electrical connector of claim 12 wherein the visible indicators are text characters.

15. The electrical connector of claim 1 wherein the base portion includes positioning elements for fixing the relative position of the base portion and the interconnect portion.

16. The electrical connector of claim 15 wherein at least a portion of the positioning elements are positioning pins.

17. The electrical connector of claim 15 wherein the base and alignment members are configured to be mated in only one relative position.

18. The electrical connector of claim 1 wherein each of the contacts of the multi-contact linear arrays is contacted by a single corresponding pin.

19. The electrical connector of claim 1 wherein the closure elements removably hold the base portion and the interconnect portion together.

20. The electrical connector of claim 19 wherein the closure elements are threaded fasteners.

21. The electrical connector of claim 1 wherein the closure elements attach the base portion to the electrical system, thereby sandwiching the interconnect portion therebetween.

22. The electrical connector of claim 21 wherein the closure elements are threaded fasteners.

23. The electrical connector of claim 22 wherein the base portion is removable from the electrical connector independent of the interconnect portion.

24. The electrical connector of claim 1 wherein the base and alignment members form an integral base portion.

25. An electrical connector for connecting plural multi-contact tails of one or more in-body medical electrodes to an electrical system, the connector comprising:

a base portion including:

a base member; and an alignment member on the base member configured to hold the multi-contact tails in place;

an interconnect portion configured to mate with the base portion and including:

a printed-circuit board interconnect array having a plurality of conductive pathways to the electrical system, the circuit board having a plurality of pins mounted thereon; and one or more interface connectors mounted to the circuit board and configured to mate with one or more corresponding system connectors of the electrical system; and one or more closure elements for holding the base portion and the interconnect portion together, wherein each of the contacts of the multi-contact tails is electrically connected to a corresponding point in circuits within the electrical system.

26. The electrical connector of claim 25 wherein the base portion is made of non-ferrous materials.

27. The electrical connector of claim 26 wherein the base portion is made of non-metallic materials.

* * * * *